(12) United States Patent
Lee

(10) Patent No.: US 10,515,685 B2
(45) Date of Patent: Dec. 24, 2019

(54) SEMICONDUCTOR MEMORY DEVICE FOR PERFORMING ERASE OPERATION AND OPERATING METHOD THEREOF

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/102,388

(22) Filed: Aug. 13, 2018

(65) Prior Publication Data

US 2018/0358082 A1    Dec. 13, 2018

Related U.S. Application Data

(62) Division of application No. 15/613,736, filed on Jun. 5, 2017, now Pat. No. 10,083,738.

(30) Foreign Application Priority Data

Aug. 16, 2016 (KR) .................. 10-2016-0103582

(51) Int. Cl.
| | |
|---|---|
| *G11C 16/04* | (2006.01) |
| *G11C 11/408* | (2006.01) |
| *G11C 16/16* | (2006.01) |
| *G11C 16/10* | (2006.01) |
| *G11C 16/34* | (2006.01) |

(52) U.S. Cl.
CPC ...... *G11C 11/4085* (2013.01); *G11C 16/0483* (2013.01); *G11C 16/10* (2013.01); *G11C 16/107* (2013.01); *G11C 16/16* (2013.01); *G11C 16/3445* (2013.01); *G11C 16/3459* (2013.01)

(58) Field of Classification Search
CPC ....................................... G11C 16/16
USPC ..................................... 365/185.29
See application file for complete search history.

(56) References Cited

U.S. PATENT DOCUMENTS

| | | |
|---|---|---|
| 2008/0219053 A1 | 9/2008 | Kim |
| 2012/0170365 A1 | 7/2012 | Kang et al. |
| 2015/0221380 A1* | 8/2015 | Lee .......... G11C 16/10 365/185.11 |

FOREIGN PATENT DOCUMENTS

| | | |
|---|---|---|
| KR | 101062032 B1 | 9/2011 |
| KR | 1020140028957 A | 10/2014 |

* cited by examiner

*Primary Examiner* — Hoai V Ho
(74) *Attorney, Agent, or Firm* — William Park & Associates Ltd.

(57) ABSTRACT

Provided herein are a semiconductor memory device and a method of operating the semiconductor memory device. The semiconductor memory device having improved reliability includes a memory cell array including memory cells coupled to a plurality of word lines, a peripheral circuit configured to perform a program operation on a word line selected from among the plurality of word lines, and control logic configured to control the peripheral circuit so that, when the selected word line is a reference word line during the program operation, a partial erase operation is performed on memory cells included in a memory cell group corresponding to the reference word line.

5 Claims, 10 Drawing Sheets

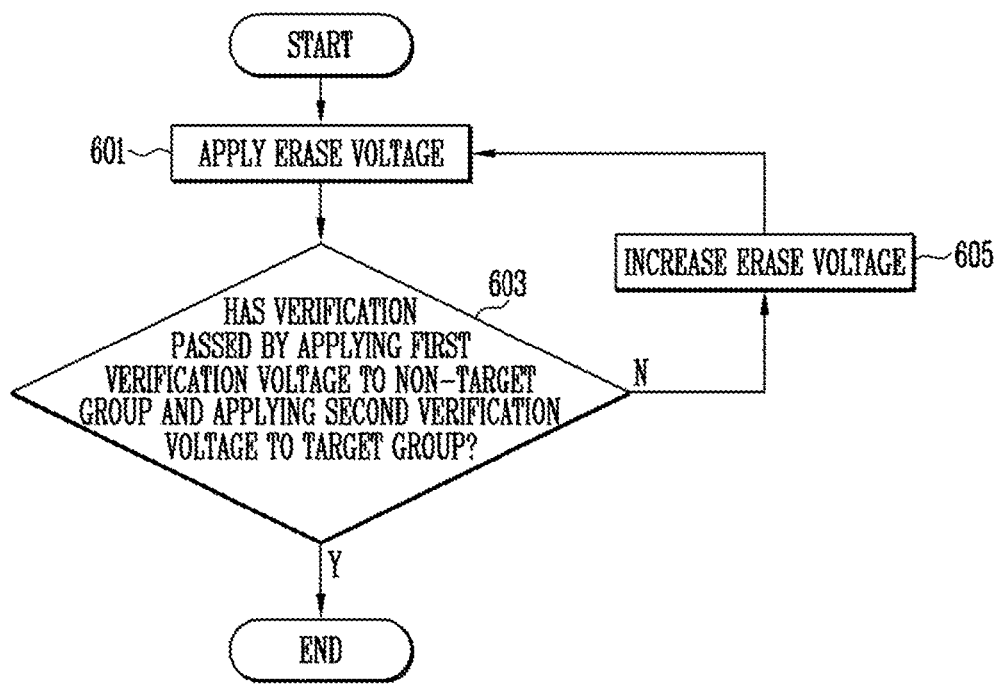

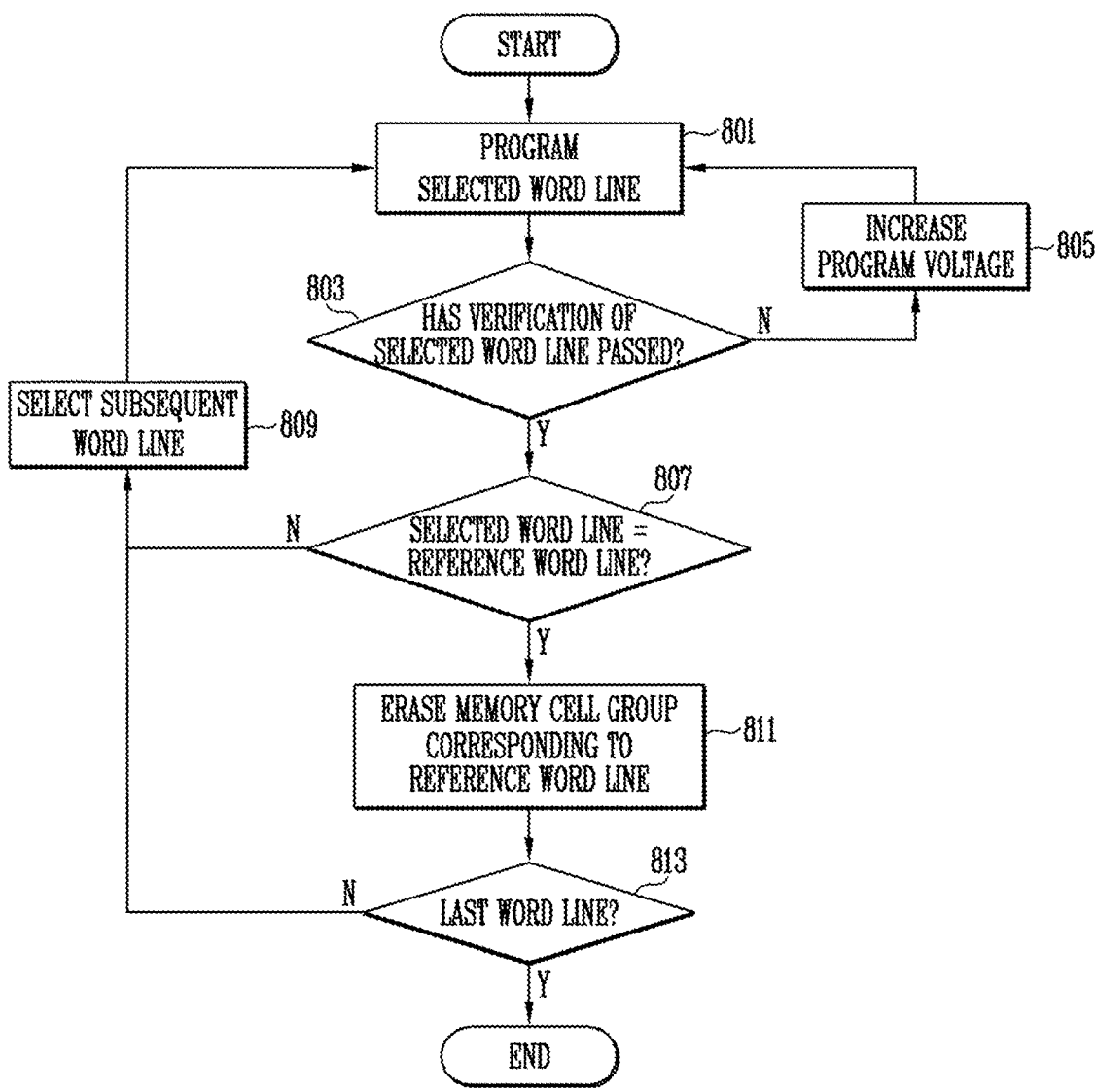

FIG. 9

|  | NON-TARGET GROUP | TARGET GROUP | | | |
|---|---|---|---|---|---|
|  |  | FIRST MEMORY CELL GROUP | SECOND MEMORY CELL GROUP | ... | k-TH MEMORY CELL GROUP |
| FIRST REFERENCE WORD LINE | ERASE PROHIBITION (high potential) | PARTIAL ERASE | ERASE PROHIBITION(low potential) | | |
| SECOND REFERENCE WORD LINE | ERASE PROHIBITION (high potential) | | PARTIAL ERASE | ERASE PROHIBITION (low potential) | |
| ⋮ | | | ⋮ | | |
| k-TH REFERENCE WORD LINE | ERASE PROHIBITION(high potential) | | | | PARTIAL ERASE |

SEMICONDUCTOR MEMORY DEVICE FOR PERFORMING ERASE OPERATION AND OPERATING METHOD THEREOF

CROSS-REFERENCE TO RELATED APPLICATION

The present application is a divisional application of application number U.S. Ser. No. 15/613,736 and claims priority under 35 U.S.C. § 119(a) to Korean patent application number 10-2016-0103582 filed on Aug. 16, 2016 in the Korean Intellectual Property Office, the entire disclosure of which is incorporated herein by reference.

BACKGROUND

1. Technical Field

Various embodiments of the present disclosure relate to an electronic device, and more particularly, to a semiconductor memory device and a method of operating the semiconductor memory device.

2. Related Art

Semiconductor memory devices are memory devices realized using a semiconductor such as silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when power is turned off. Representative examples of volatile memory devices include a static RAM (SRAM), a dynamic RAM (DRAM), a synchronous DRAM (SDRAM), etc. The nonvolatile memory device is a memory device in which data stored therein is maintained even when power is turned off. Representative examples of nonvolatile memory devices include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type memory and a NAND type memory.

SUMMARY

Various embodiments of the present disclosure are directed to a semiconductor memory device which has improved reliability, and a method of operating the semiconductor memory device.

One embodiment of the present disclosure provides a semiconductor memory device, including a memory cell array including memory cells coupled to a plurality of word lines, a peripheral circuit configured to perform a program operation on a word line selected from among the plurality of word lines, and control logic configured to control the peripheral circuit so that, when the selected word line is a reference word line during the program operation, a partial erase operation is performed on memory cells included in a memory cell group corresponding to the reference word line.

The present disclosure provides a semiconductor memory device, including a memory cell array including a plurality of memory blocks, a peripheral circuit configured to erase a memory block selected from among the plurality of memory blocks, and control logic configured to control the peripheral circuit so that a threshold voltage of memory cells included in a first word line group, among the plurality of memory cells included in the selected memory block, is erased in a first erase state, and memory cells included in a second word line group corresponding to word lines other than the first word line group are erased in a second erase state, wherein a threshold voltage in the first erase state has a level lower than that of a threshold voltage in the second erase state.

Further, the present disclosure provides a method of operating a semiconductor memory device including memory cells coupled to a plurality of word lines, the method including performing a program operation on a word line selected from among a plurality of word lines, and when the selected word line is a reference word line during the program operation, performing a partial erase operation on memory cells included in a memory cell group corresponding to the reference word line.

BRIEF DESCRIPTION OF THE DRAWINGS

Example embodiments will now be described more fully hereinafter with reference to the accompanying drawings; however, the example embodiments may be embodied in different forms and should not be construed as limited to the embodiments set forth herein. Rather, these embodiments are provided so that this disclosure will be thorough and complete, and will fully convey a scope of the example embodiments to those skilled in the art.

In the drawing figures, dimensions may be exaggerated for clarity of illustration. It will be understood that when an element is referred to as being "between" two elements, the element may be the only element between the two elements, or one or more intervening elements may also be present. Like reference numerals refer to like elements throughout.

FIG. 6 is a flowchart showing an erase method of the semiconductor memory device according to an embodiment of the present disclosure;

FIG. 7 is a diagram showing an erase state and the verification voltage of memory cells during the erase operation of FIG. 6;

FIG. 8 is a flowchart showing a program method of the semiconductor memory device according to an embodiment of the present disclosure;

FIG. 9 is a diagram showing the erase state of memory cell groups during the program operation of FIG. 8;

DETAILED DESCRIPTION

Figure 1:
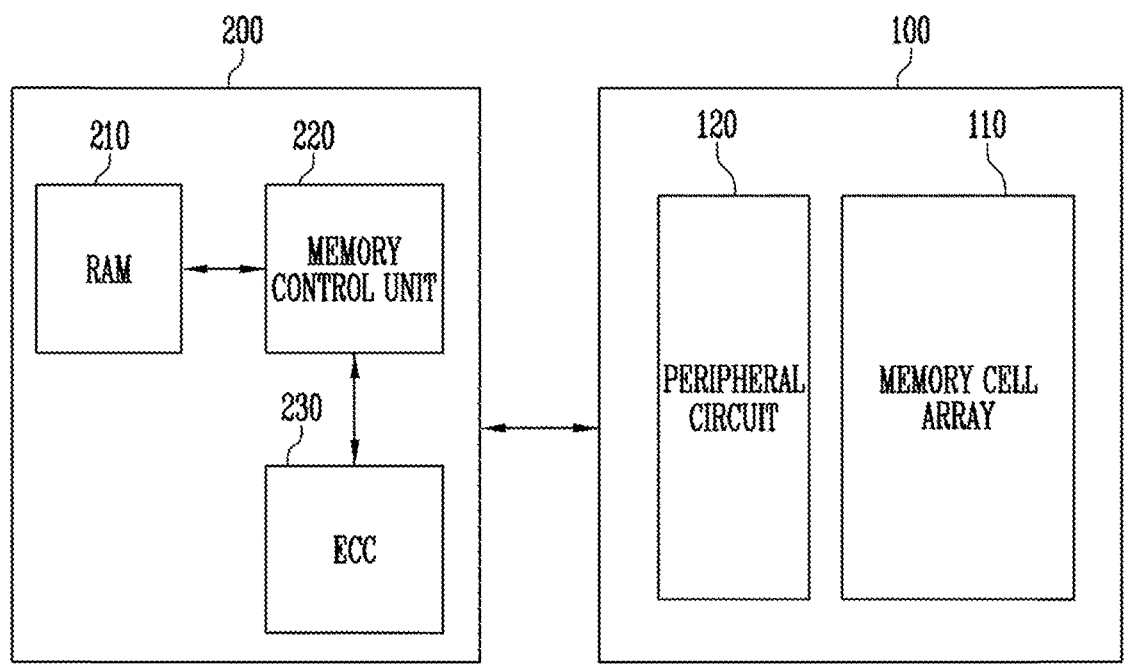
FIG. 1 is a block diagram showing a configuration of a memory system.

Hereinafter, embodiments will be described in greater detail with reference to the accompanying drawings.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but the terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as the form is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Hereinafter, the present disclosure will be described in detail by describing exemplary embodiments of the present disclosure with reference to the attached drawings. Below, embodiments of the present disclosure will be described in detail with reference to the attached drawings.

FIG. 1 is a block diagram showing a configuration of a memory system.

The memory system 50 includes a semiconductor memory device 100 and a controller 200.

The semiconductor memory device 100 may take many alternative forms, such as a NAND flash memory, vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM), for example. In addition, the semiconductor memory device 100 according to an embodiment of the present disclosure may be implemented as a three-dimensional array structure. The present disclosure may also be applied not only to a flash memory in which a charge storage layer is implemented as a conductive floating gate (FG), but also to a charge trap flash (CFT) memory in which a charge storage layer is implemented as an insulating layer.

The semiconductor memory device 100 includes a memory cell array 110 and a peripheral circuit 120 for driving the memory cell array 110. The memory cell array 110 includes a plurality of nonvolatile memory cells.

The memory cell array 110 also includes a plurality of memory blocks, which may be used such that the memory blocks are divided into system blocks and user blocks according to the use thereof.

In an embodiment, the memory cell array 110 may include a Content Addressable Memory (CAM) area. The CAM area may include a plurality of memory cells, which are included in at least one memory block. In the CAM area, various types of setup information required for operation of the semiconductor memory device 100 may be stored. For example, in the CAM area, conditions or other pieces of information which are set in relation to a data input/output operation may be stored. In an embodiment, in the CAM area, information about the number of read/write operations (Program/Erase (P/E) cycle), an erroneous column address, and an erroneous block address may be stored. In an embodiment, in the CAM area, option information required for the operation of the semiconductor memory device 100, for example, program voltage information, read voltage information, erase voltage information, thickness information of the gate oxide film of each cell, etc., may be stored.

When power is supplied to the semiconductor memory device 100, information stored in the CAM area is read by the peripheral circuit 120, and the peripheral circuit 120 may control the memory cell array 110 so that the data input/output operation on the memory cells is performed under set conditions, based on the read information.

The peripheral circuit 120 is operated under control of the controller 200. The peripheral circuit 120 may program data in the memory cell array 110 under control of the controller 200. The peripheral circuit 120 may be operated such that data is read from the memory cell array 110 and data in the memory cell array 110 is erased.

In various embodiments, the read operation and the program operation of the semiconductor memory device 100 may be performed based on a page. The erase operation of the semiconductor memory device 100 may be performed based on a memory block.

During a program operation, the peripheral circuit 120 may receive a command indicating a program operation, a physical block address PBA, and may also receive write data from the controller 200. The peripheral circuit 120 may program data in a selected page when a single memory block and a single page included in the corresponding memory block are selected in response to receiving the physical block address PBA.

During a read operation, the peripheral circuit 120 may receive a command indicating a read operation (hereinafter referred to as a "read command") and a physical block address PBA from the controller 200. The peripheral circuit 120 may read data from a single memory block selected in response to the physical block address PBA and from a page included in the memory block, and output the read data (hereinafter referred to as "page data") to the controller 200.

During an erase operation, the peripheral circuit 120 may receive a command indicating an erase operation and a physical block address PBA from the controller 200. The physical block address PBA may specify a single memory block. The peripheral circuit 120 may erase data stored in the memory block corresponding to the physical block address PBA.

The controller 200 controls the overall operation of the semiconductor memory device 100. The controller 200 may access the semiconductor memory device 100 in response to a request from an external host. The controller 200 may provide a command to the semiconductor memory device 100 in response to the request from the external host.

In an embodiment, the controller 200 may control the semiconductor memory device 100 so that a program operation, a read operation, or an erase operation is performed. In the program operation, the controller 200 may provide the program command, the address and the data to the semiconductor memory device 100 through a channel. In the read operation, the controller 200 may provide the read command and the address to the semiconductor memory device 100 through a channel. In the erase operation, the controller 200 may provide the erase command and the address to the semiconductor memory device 100 through a channel.

The controller 200 may include a Random Access Memory (RAM) 210, a memory control unit 220, and an error correction code (ECC) circuit 230.

The RAM 210 is operated under control of the memory control unit 220 and may be used as a work memory, a buffer memory, a cache memory, or the like. When the RAM 210 is used as the work memory, data processed by the memory control unit 220 may be temporarily stored. When the RAM 210 is used as the buffer memory, the RAM may be used to buffer data that is to be transmitted from a host (not shown) to the semiconductor memory device 100 or from the semiconductor memory device 100 to the host (not shown).

The memory control unit 220 is configured to control a read operation, a program operation, an erase operation, and a background operation of the semiconductor memory device 100. The memory control unit 220 is configured to run firmware for controlling the semiconductor memory device 100.

The memory control unit 220 may perform a function of a Flash Translation Layer (FTL). The memory control unit 220 may translate a logical block address (LBA), provided by the host, into a physical block address (PBA) through the FTL. The FTL may receive the LBA using a mapping table and may translate the LBA into the PBA. Address mapping methods performed through the FTL include various methods according to a mapping unit. Representative address mapping methods include a page mapping method, a block mapping method, and a hybrid mapping method.

The ECC circuit 230 generates parity that is an ECC for data to be programmed. Further, during a read operation, the ECC circuit 230 may correct an error using the parity from read page data. The ECC circuit 230 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the ECC circuit 230 may correct errors from read page data. When a number of error bits exceeding the number of correctable bits are included in the read page data, decoding may fail. When a number of error bits less than or equal to the number of correctable bits are included in the page data, decoding may succeed.

A success in decoding indicates that the corresponding read command has passed. A failure in decoding indicates that the corresponding read command has failed. When decoding succeeds, the controller 200 outputs error-corrected page data to the host.

Although not shown in the drawing, the controller 200 may further include a memory interface for communicating with the semiconductor memory device 100. The memory interface includes a protocol for communicating with the semiconductor memory device 100. For example, the memory interface may include at least one of flash interface such as a NAND interface and a NOR interface.

The controller 200 may further include a host interface (not shown) to perform data exchange between the host and the controller 200. The host interface includes protocols required for communication between the host and the controller 200. In an exemplary embodiment, the controller 200 is configured to communicate with an external system (host) through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

Figure 2:
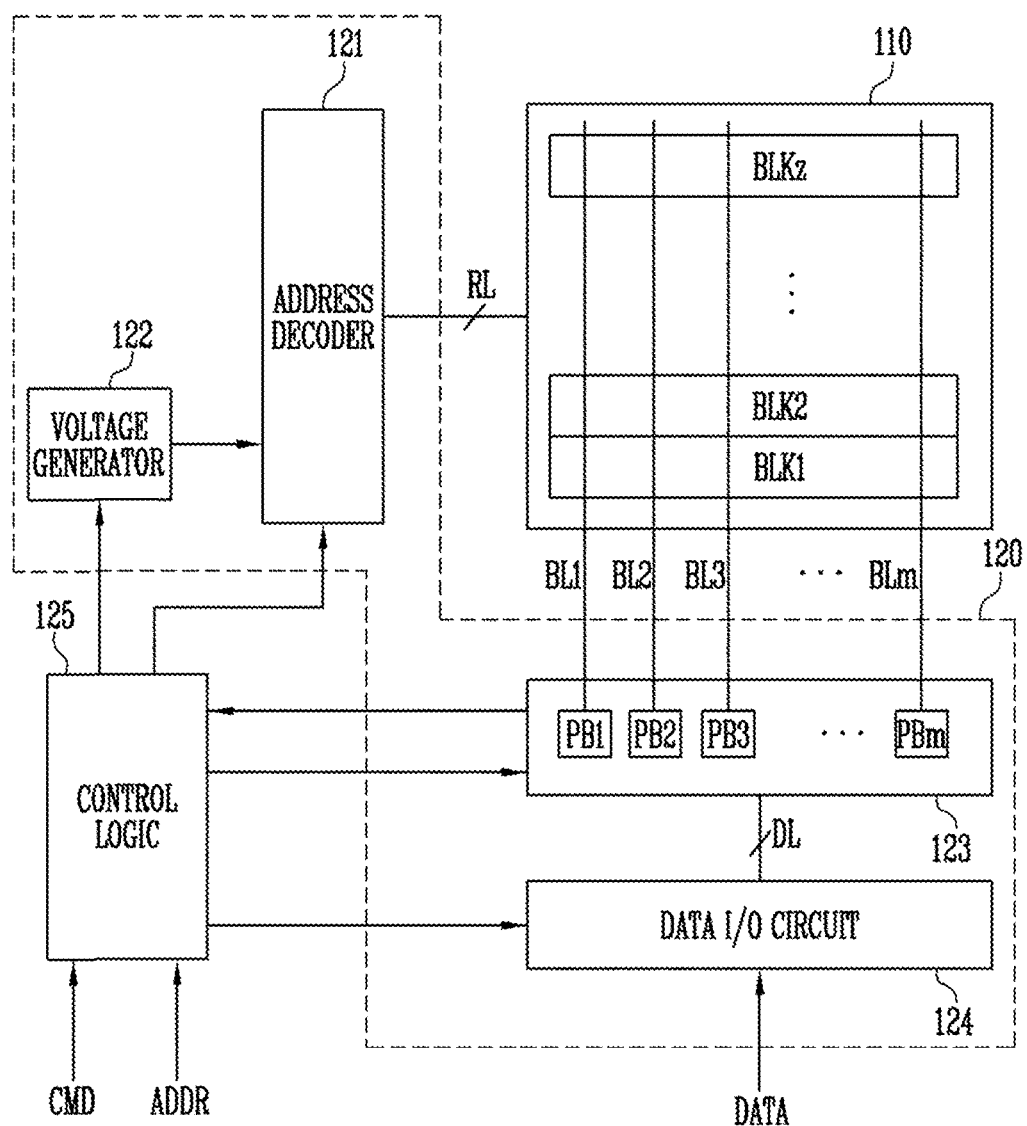
FIG. 2 is a block diagram showing a semiconductor memory device according to an embodiment of the present disclosure.

FIG. 2 is a block diagram showing a semiconductor memory device according to an embodiment of the present disclosure.

Figure 3:
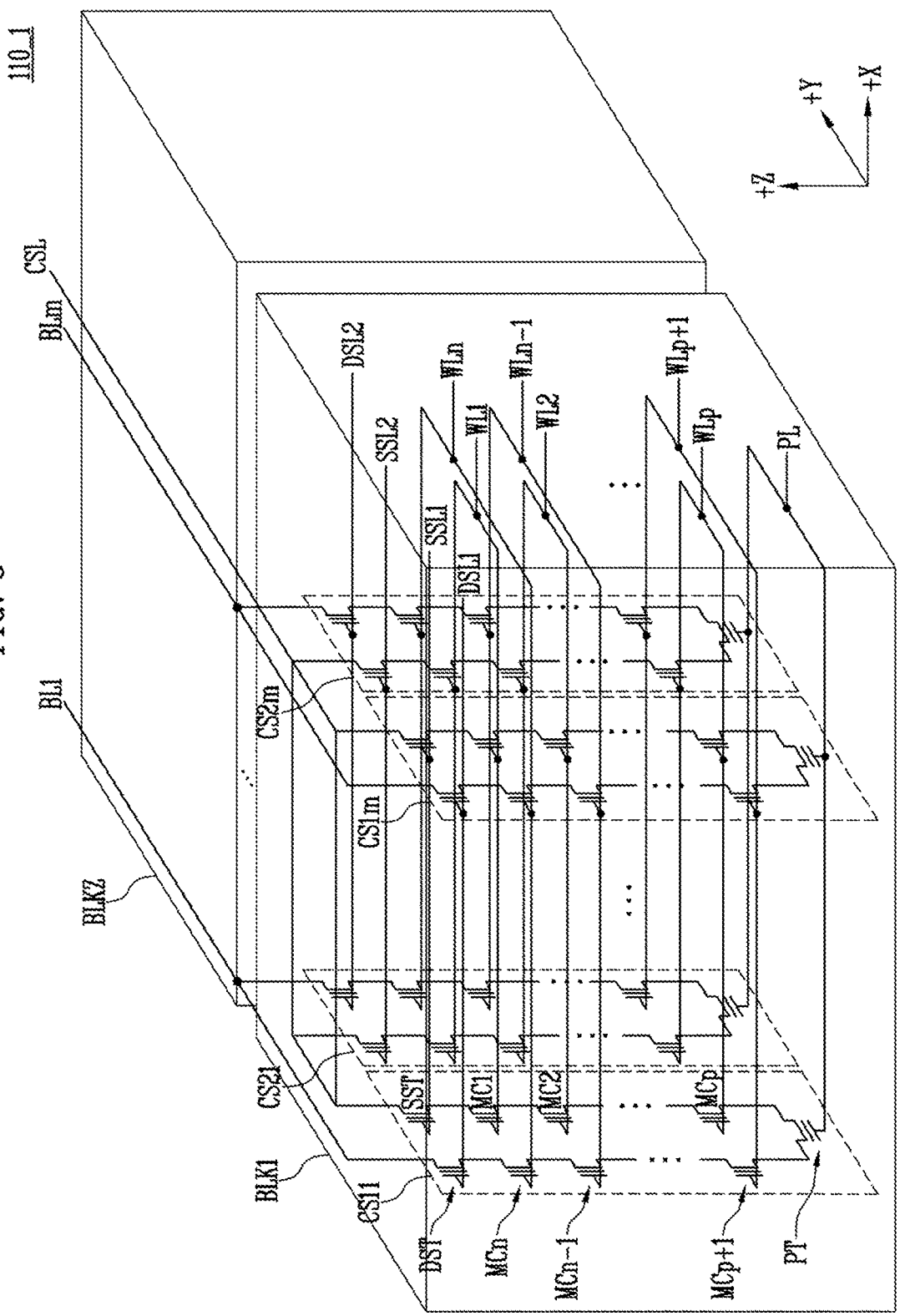
FIG. 3 is a diagram showing a structure of a memory cell array of FIG. 2.

FIG. 3 is a diagram showing the structure of the memory cell array 110 of FIG. 2.

Referring to FIG. 2, the semiconductor memory device 100 includes the memory cell array 110, a peripheral circuit 120, and control logic 125.

The memory cell array 110 includes a plurality of memory blocks BLK1 to BLKz. The plurality of memory blocks BLK1 to BLKz are coupled to an address decoder 121 through row lines RL and are coupled to a read and write circuit 123 through bit lines BL1 to BLm. Each of the memory blocks BLK1 to BLKz includes a plurality of memory cells. In an exemplary embodiment, the memory cells are nonvolatile memory cells.

The plurality of memory cells included in the memory cell array 110 may be used such that the memory cells are divided into a plurality of blocks according to the use thereof.

Referring to FIG. 3, a memory cell array 110_1 includes a plurality of memory blocks BLK1 to BLKz. In FIG. 3, for the convenience of description, the internal configuration of the first memory block BLK1 is illustrated, and the internal configuration of the remaining memory blocks BLK2 to BLKz is omitted. It should be understood that the second to z-th memory blocks BLK2 to BLKz are configured in a substantially similar manner as the first memory block BLK1.

Referring to FIG. 3, the first memory block BLK1 includes a plurality of cell strings CS11 to CS1$m$ and CS21 to CS2$m$. In an embodiment, each of the cell strings CS11 to CS1$m$ and CS21 to CS2$m$ may be formed in a 'U' shape. In the first memory block BLK1, m cell strings are arranged in a row direction (i.e. +X direction). In FIG. 3, two cell strings are shown as being arranged in a column direction (i.e. +Y direction). However, this illustration is made for convenience of description, and it should be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are connected to a source select line extended in a row direction, and source select transistors of cell strings arranged in different rows are connected to different source select lines. In FIG. 3, source select transistors of cell strings CS11 to CS1m in a first row are connected to a first source select line SSL1. The source select transistors of cell strings CS21 to CS2m in a second row are connected to a second source select line SSL2.

In another embodiment, source select transistors of the cell strings CS11 to CS1m and CS21 to CS2m may be coupled in common to a single source select line.

The first to n-th memory cells MC1 to MCn in each cell string are connected between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite the +Z direction, and are connected in series between the source select transistor SST and the pipe transistor PT. The p+1-th to n-th memory cells MCp+1 to MCn are sequentially arranged in the +Z direction, and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding cell string may be stably controlled. Accordingly, the reliability of data stored in the memory block BLK1 is improved.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extended in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Figure 4:
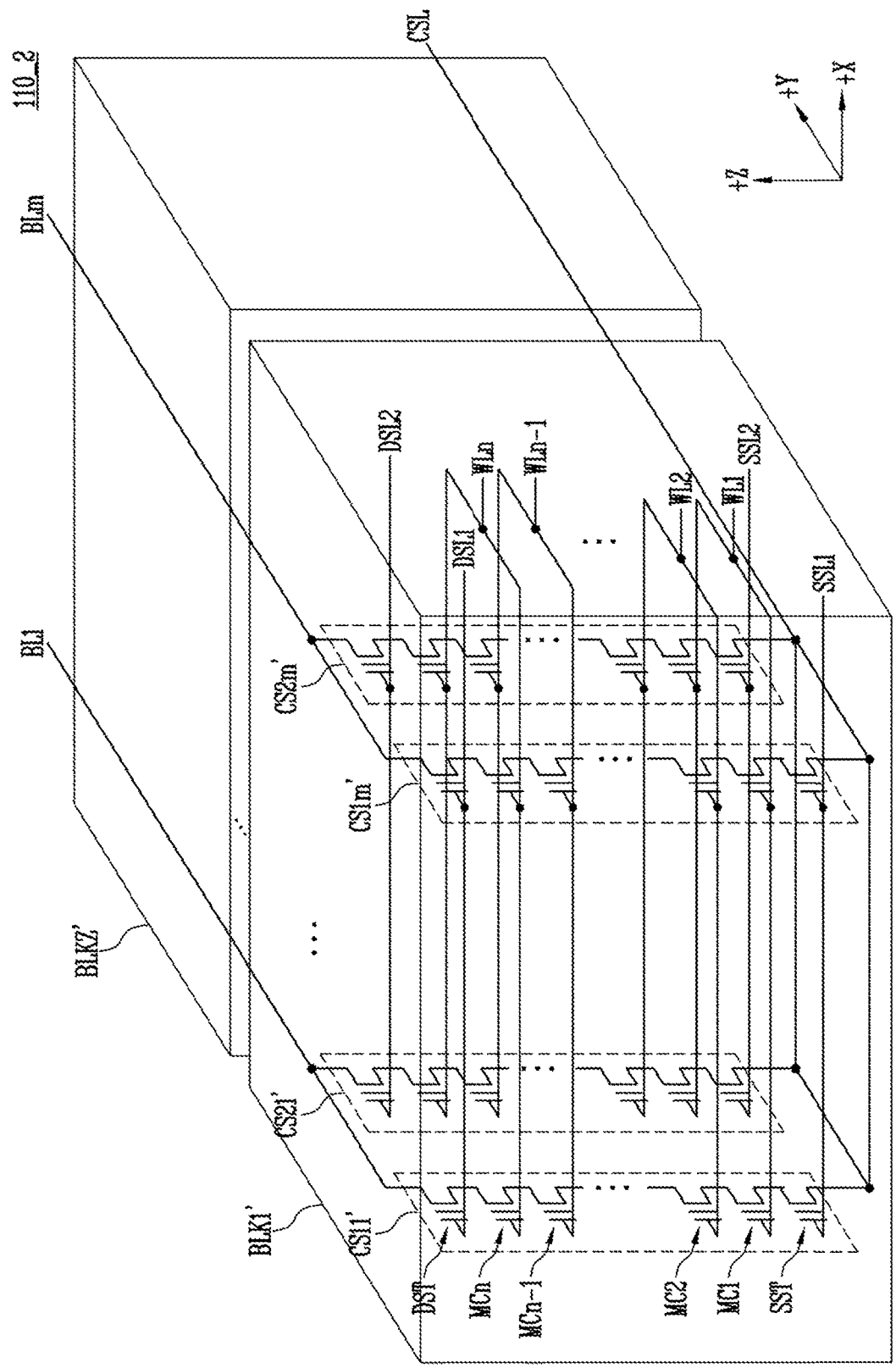
FIG. 4 is a diagram showing another embodiment of the memory cell array of FIG. 2.

Cell strings arranged in a column direction are coupled to bit lines extended in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line in cell strings arranged in a row direction constitute a single page. For example, memory cells coupled to the first word line WL1 among cell strings CS11 to CS1m in the first row constitute a single page. Memory cells coupled to the first word line WL1 among the cell strings CS21 to CS2m in the second row constitute a single additional page. Cell strings arranged in the direction of a single row may be selected by selecting any one of the drain select lines DSL1 and DSL2. A single page may be selected from the selected cell strings by selecting any one of the word lines WL1 to WLn.

Referring back to FIG. 2, the peripheral circuit 120 includes an address decoder 121, a voltage generator 122, a read and write circuit 123, and a data input/output (I/O) circuit 124. The address decoder 121 is coupled to the memory cell array 110 through row lines RL. The address decoder 121 is configured to operate under the control of the control logic 125. The address decoder 121 receives an address ADDR through the control logic 125.

In an embodiment, a program operation and a read operation of the semiconductor memory device 100 are performed based on a page. During the program operation and the read operation, the address ADDR may include a block address and a row address. The address decoder 121 is configured to decode a block address included in the received address ADDR. The address decoder 121 selects one of the memory blocks BLK1 to BLKz in response to the decoded block address. The address decoder 121 is configured to decode a row address in the received address ADDR. The address decoder 121 selects a single word line from the selected memory block by applying voltages, provided by the voltage generator 122, to row lines RL in response to the decoded row address.

During a program operation, the address decoder 121 may apply a program voltage to a selected word line and apply a pass voltage having a level lower than that of the program voltage to unselected word lines. During a program verify operation, the address decoder 121 may apply a verification voltage to a selected word line and apply a verification pass voltage higher than the verification voltage to unselected word lines.

During a read operation, the address decoder 121 may apply a read voltage to the selected word line and apply a pass voltage higher than the read voltage to the unselected word lines.

In an embodiment, an erase operation of the semiconductor memory device 100 is performed based on a memory block. During the erase operation, the address ADDR includes a block address. The address decoder 121 decodes the block address and selects a single memory block in response to the decoded block address. In an embodiment, the erase operation may be performed only on a part of a single memory block in the semiconductor memory device 100 (partial erase). During a partial erase operation, the address ADDR may include block and row addresses. The address decoder 121 selects one of the memory blocks BLK1 to BLKz in response to the decoded block address.

The address decoder 121 is configured to decode row addresses included in the received address ADDR. The address decoder 121 selects at least one word line from the selected memory block by applying voltages, provided by the voltage generator 122, to the row lines RL depending on the decoded row addresses.

In an embodiment, the address decoder 121 may include a block decoder, a word line decoder, an address buffer, etc.

The voltage generator 122 is configured to generate a plurality of voltages using an external supply voltage that is provided to the semiconductor memory device 100. The voltage generator 122 is operated under the control of the control logic 125.

In an embodiment, the voltage generator 122 may generate an internal supply voltage by regulating the external supply voltage. The internal supply voltage generated by the voltage generator 122 is used as an operating voltage for the semiconductor memory device 100.

In an embodiment, the voltage generator 122 may generate a plurality of voltages using the external supply voltage or the internal supply voltage. For example, the voltage generator 122 may include a plurality of pumping capacitors for receiving the internal supply voltage, and may generate a plurality of voltages by selectively activating the plurality of pumping capacitors under the control of the control logic 125. The generated voltages are applied to the word lines selected by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm. The first to m-th page buffers PB1 to PBm are operated under the control of the control logic 125.

The first to m-th page buffers PB1 to PBm transmit/receive data to/from the data I/O circuit 124. During a program operation, the first to m-th page buffers PB1 to PBm may receive data DATA to be stored through the data I/O circuit 124 and data lines DL.

During a program operation, when a program pulse is applied to the selected word line, the first to m-th page buffers PB1 to PBm may transfer the data DATA to be stored, that is, the data DATA received through the data I/O circuit 124, to the selected memory cells through the bit lines BL1 to BLm. The memory cells of the selected page are programmed depending on the data DATA. A memory cell coupled to a bit line to which a program permission voltage (e.g. a ground voltage) is applied may have an increased threshold voltage. The threshold voltage of the memory cell coupled to a bit line to which a program prohibition voltage (e.g. a supply voltage) is applied may be maintained. During a program verify operation, the first to m-th page buffers PB1 to PBm may read page data from the selected memory cells through the bit lines BL1 to BLm.

Meanwhile, the memory cells of the semiconductor memory device 100 may be classified as a single level cell (SLC) capable of storing a single data bit, a multi-level cell (MLC) capable of storing two data bits, a triple-level cell (TLC) capable of storing three data bits, and a quad-level cell (QLC) capable of storing four data bits.

During a read operation, the read and write circuit 123 reads data DATA from memory cells in the selected page through bit lines BL, and outputs the read data DATA to the data I/O circuit 124.

During an erase operation, the read and write circuit 123 may float the bit lines BL.

The data I/O circuit 124 is coupled to the first to m-th page buffers PB1 to PBm through data lines DL. The data I/O circuit 124 is operated under control of the control logic 125. During a program operation, the data I/O circuit 124 receives data DATA to be stored from an external controller (not shown).

The data I/O circuit 124 outputs data transferred from the first to m-th page buffers PB1 to PBm, included in the read and write circuit 123, to the external controller during a read operation.

The control logic 125 is coupled to the address decoder 121, the voltage generator 122, the read and write circuit 123, and the data I/O circuit 124. The control logic 125 may control the overall operation of the semiconductor memory device 100. The control logic 125 receives a command CMD and an address ADDR from the external controller. The control logic 125 is configured to control the address decoder 121, the voltage generator 122, the read and write circuit 123, and the data I/O circuit 124 in response to the command CMD. The control logic 125 transfers the address ADDR to the address decoder 121.

The control logic 125 may perform a program operation by controlling the address decoder 121, the voltage generator 122, and the read and write circuit 123. The control logic 125 may control the address decoder 121, voltage generator 122, and the read and write circuit 123 so that voltages required for the program operation are applied to word lines and bit lines while a program operation is performed.

In accordance with an embodiment of the present disclosure, the control logic 125 may control the peripheral circuit 120 to perform a partial erase operation on memory cells included in a memory cell group corresponding to a reference word line when a program command corresponding to the reference word line is inputted during the program operation. In this case, an erase prohibition voltage is applied to memory cells other than memory cells of the memory cell group on which the partial erase operation is performed, thus preventing data in the memory cells from being erased. In other words, the control logic 125 may set memory cells other than memory cells included in the memory cell group to an erase prohibition state while the partial erase operation is performed. Still further, the partial erase operation may be performed when the address of a memory cell corresponding to the program operation is equal to an address of the reference word line corresponding to the program command.

In an embodiment, the control logic 125 may perform an erase operation on all memory blocks. In this case, a shallow erase operation may be performed on some of all of the memory blocks.

FIG. 4 is a diagram showing another embodiment of the memory cell array 110 of FIG. 2.

Referring to FIG. 4, a memory cell array 110_2 includes a plurality of memory blocks BLK1' to BLKz'. In FIG. 4, for the convenience of description, the internal configuration of the first memory block BLK1' is illustrated, and the illustration of the internal configuration of the remaining memory blocks BLK2' to BLKz' is omitted. It should be understood that the second to z-th memory blocks BLK2' to BLKz' are configured in the same manner as the first memory block BLK1'.

The first memory block BLK1' includes a plurality of cell strings CS11' to CS1$m$' and CS21' to CS2$m$'. In an embodiment, each of the cell strings CS11' to CS1$m$' and CS21' to CS2$m$' may be formed in an 'I' shape. Each of the plurality of cell strings CS11' to CS1$m$' and CS21' to CS2$m$' is extended along a +Z direction. In the first memory block BLK1, m cell strings are arranged in a +X direction. In FIG. 4, two cell strings are shown as being arranged in a +Y direction. However, this configuration is made for the convenience of description, and it should be understood that three or more cell strings may be arranged in a column direction. Nevertheless, the memory cell array 110_2 may include cell strings CS11' to CS1$m$' and CS21' to CS2$m$' formed in a three-dimensional structure.

Each of the cell strings CS11' to CS1$m$' and CS21' to CS2$m$' includes at least one source select transistor SST, first to n-th memory cells MC1 to MCn, and at least one drain select transistor DST.

The source select transistor SST of each cell string is connected between a common source line CSL and memory cells MC1 to MCn. The source select transistors of cell strings arranged in the same row are connected to the same source select line. Source select transistors of cell strings CS11' to CS1$m$' arranged in the first row are coupled to a first source select line SSL1. Source select transistors of cell strings CS21' to CS2m' arranged in a second row are coupled to a second source select line SSL2. In another embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are connected to first to n-th word lines WL1 to WLn.

In an embodiment, at least one of the first to n-th memory cells MC1 to MCn may be used as a dummy memory cell. When a dummy memory cell is provided, the voltage or current of the corresponding cell string may be stably controlled. Accordingly, reliability of data stored in the memory block BLK1' is improved.

The drain select transistor DST of each cell string is connected between the corresponding bit line and the memory cells MC1 to MCn. Drain select transistors of cell strings arranged in a row direction are coupled to drain select lines extended in a row direction. The drain select transistors of the cell strings CS11' to CS1m' in the first row are connected to a first drain select line DSL1. The drain select transistors of the cell strings CS21' to CS2m' in the second row are coupled to a second drain select line DSL2.

As a result, the memory block BLK1' of FIG. 4 has the same equivalent circuit as the memory block BLK1 of FIG. 3 except that a pipe transistor PT is excluded from each cell string in FIG. 4.

Figure 5:
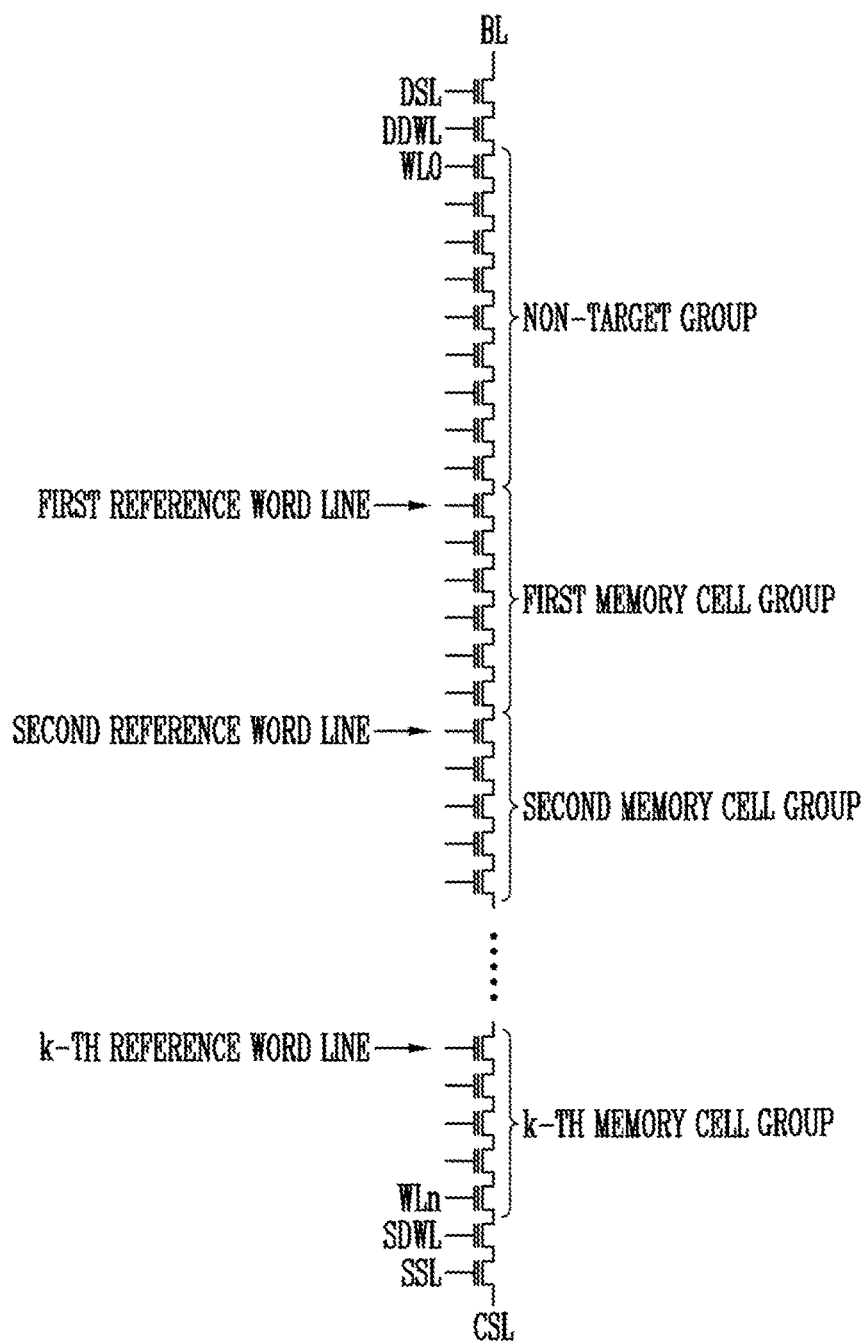
FIG. 5 is a diagram showing a memory cell string of the semiconductor memory device according to an embodiment of the present disclosure.

FIG. 5 is a diagram for explaining the memory cell string of the semiconductor memory device according to an embodiment of the present disclosure. The memory cell string illustrated in FIG. 5 may be included in the memory cell array illustrated in FIG. 3 or FIG. 4.

Referring to FIG. 5, a memory cell string may include a drain select transistor, a drain-side dummy memory cell, a plurality of memory cells, a source-side dummy memory cell, and a source select transistor, which are connected in series between a bit line BL and a common source line CSL. The drain select transistor is coupled to a drain select line DSL. The drain-side dummy memory cell is coupled to a drain dummy word line DDWL. The plurality of memory cells are coupled to a plurality of word lines WL0 to WLn, respectively. The source-side dummy memory cell is coupled to a source dummy word line SDWL. The source select transistor may be coupled to a source select line SSL.

In accordance with an embodiment of the present disclosure, the semiconductor memory device may perform a partial erase operation for erasing a part of a memory block before or while a program operation is performed. The reason for erasing a part of the memory block while the program operation is performed is to initialize a distribution of threshold voltages of memory cells, coupled to a page in an erase state, to an erase state while a program operation is performed on the selected pages. More specifically, when the program operation is performed, a pass voltage is applied to word lines coupled to unselected memory cells. In this case, when the unselected memory cells are continuously influenced by the pass voltage, the threshold voltages of the unselected memory cells may change. For example, when a program disturbance is increased, the threshold voltages of memory cells in an erase state may be increased. A page selected during a program operation includes a plurality of memory cells. The memory cells included in the selected page may include memory cells which should be maintained in an erase state. When these memory cells are subjected to a program disturbance, the threshold voltages of the memory cells may be increased, thus causing an error in a read operation. In particular, due to the structural characteristics of a 3D memory device, the area of a channel is narrowed in a direction from a top (upper direction) to a bottom (lower direction) of a string, and thus memory cells located in a lower portion or lower direction of the string may be subjected to a stronger program disturbance than memory cells located in an upper portion or upper direction of the string. Therefore, as the sequential position (turn) of the program operation of a page is later, or as a page is located in a lower portion of the string, a program disturbance may be increased. Accordingly, a partial erase operation is performed on the corresponding pages, thus preventing the threshold voltages of the memory cells from changing. The partial erase operation may be performed using an Incremental Step Pulse Erase (ISPE) scheme in which an erase voltage is gradually increased, or a scheme in which an erase verify operation is omitted and only an erase voltage is used. Further, in one example, another program operation of programming pages, on which the erase operation has been performed may be performed.

In accordance with an embodiment of the present disclosure, memory cells included in a memory cell string may be divided into a non-target group and a target group. When a program operation is performed on memory cells included in the non-target group, a partial erase operation is not performed. Memory cells included in the target group may be subdivided into first to k-th memory cell groups.

Meanwhile, among a plurality of word lines to which memory cells are coupled, one or more reference word lines may be defined. The locations of the reference word lines may be determined differently for respective memory blocks. Each of the reference word lines may correspond to any one of a plurality of memory cell groups. Accordingly, each memory block may include a plurality of memory cell groups corresponding to one or more reference word lines.

The semiconductor memory device may program data in one or more pages according to the program operation. Here, when the reference word line is reached, a partial erase operation on a memory cell group corresponding to the reference word line may be performed.

Each memory string may include multiple reference word lines. Each of the memory strings may include a plurality of memory cell groups corresponding to the plurality of reference word lines. Each memory cell group may include a plurality of memory cells. In an embodiment, the number of memory cells included in each memory cell group may differ. A single memory cell group may be defined as memory cells coupled to a preset number of word lines adjacent to the corresponding reference word line.

In accordance with an embodiment of the present disclosure, an erase operation of the memory block is performed such that memory cells included in a non-target group perform a normal erase operation such that memory cells included in a target group perform an erase operation to have a shallow erase state. That is, as a program operation is performed subsequently, memory cells included in the target group are erased again through a partial erase operation, and thus erase stress applied to the memory cells may be reduced.

Further, in accordance with an embodiment of the present disclosure, during a program operation, only memory cells included in a specific memory cell group are partially erased, thus preventing an unnecessary erase operation from occurring and improving erase/write (E/W) cycling characteristics.

Below, an erase method according to an embodiment of the present disclosure will be described in detail with reference to FIGS. 6 and 7, and a program method according to an embodiment of the present disclosure will be described in detail with reference to FIGS. 8 and 9.

FIG. 6 is a flowchart showing an erase method of the semiconductor memory device according to an embodiment of the present disclosure.

FIG. 7 is a diagram showing an erased state and a verification voltage of memory cells during the erase operation of FIG. 6.

Referring to FIGS. 6 and 7, the semiconductor memory device may perform an erase operation at step 601. More specifically, the semiconductor memory device applies an erase voltage Verase to the common source line CSL of the memory cell array 110 at step 601. Here, the source select transistor SST and the drain select transistor DST are controlled to be in a floating state.

Thereafter, the potential level of a channel is increased according to the potential level of the common source line CSL. Due to the potential level of the channel, the potential levels of source select lines and drain select lines, which are in a floating state, may be increased through coupling. The source select lines and the drain select lines may be coupled to a plurality of source select transistors and a plurality of drain select transistors.

Due to the increased potential level of the channel, pieces of data stored in the memory cells are erased. That is, electrons stored in the charge storage layer of memory cells are detrapped by the potential of the channel due to FN tunneling. This operation will be described in greater detail below. The electrons stored in the charge storage layer of the memory cells flow out through the channel and are detrapped depending on a difference between the increased potential level of the channel and the potential level of the word lines having a ground level. Alternatively, hot holes generated in the channel flow into the charge storage layer of the memory cells and then electrons stored in the charge storage layer are detrapped. In this case, the word lines may be maintained at a ground level or may be changed from a floating state to a ground level. In accordance with an embodiment of the present disclosure, a ground level voltage is applied to word lines included in the non-target group and a voltage higher than the ground level is applied to the word lines of the plurality of memory cell groups included in the target group. Accordingly, the erase operation may be performed such that, after the erase operation, the threshold voltages (erase state+aV (Reduced Erase Vt Bias)) of the memory cells included in the target group are higher than the threshold voltages of the memory cells (erase state) included in the non-target group. In one embodiment, the control logic 125 (see FIG. 2) may be configured to control the peripheral circuit (see FIG. 2) so that a threshold voltage of memory cells included in the non-target group is erased in the erase state, and memory cells included in the target group are erased in the shallow erase state.

At step 603, the semiconductor memory device may determine whether an erase verify operation has passed by applying a first verification voltage to the word lines of the non-target group and applying a second verification voltage to the word lines of the target group. Here, the first verification voltage may be a voltage (HEV) for verifying an erase state, and the second verification voltage may be a voltage (HEV+aV) for verifying a shallow erase state. The second verification voltage may have a level higher than that of the first verification voltage.

If it is determined at step 603 that the erase verify operation has passed, the erase operation is terminated. If it is determined at step 603 that the erase verify operation has not passed, the process proceeds to step 605 where the erase voltage is increased, and then the increased erase voltage may be applied at step 601.

The memory cells included in the memory block on which the erase operation has been completed according to the embodiment of FIG. 6, may have different threshold voltages. That is, the memory cells included in the non-target group may have a threshold voltage in an erase state, and a plurality of memory cell groups included in the target group may have a threshold voltage in a shallow erase state.

FIG. 8 is a flowchart showing a program method of the semiconductor memory device according to an embodiment of the present disclosure.

FIG. 9 is a diagram showing the erase state of memory cell groups during the program operation of FIG. 8.

Referring to FIGS. 8 and 9, the semiconductor memory device may perform a program operation using an Incremental Step Pulse Program (ISPP) scheme in which a program voltage is gradually increased. When the program operation is started, the program operation on memory cells coupled to a word line selected depending on an address is performed at step 801. The program operation on the selected word line may be performed by applying the program voltage to the selected word line.

After the program voltage has been applied to the selected word line for a predetermined period of time, an operation of verifying the selected page is performed at step 803. The operation of verifying the selected page may be performed by applying a verification voltage to the selected word line. Step 801 of applying the program voltage to the selected word line and step 803 of applying the verification voltage to the selected word line may in some embodiments constitute a single program loop. In the program operation using ISPP, as the number of program loops is increased, the program voltage is gradually increased. When the operation of verifying the selected page has failed, the program voltage is increased at step 805, and steps 801 to 805 are repeated until the verify operation passes.

When the operation of verifying the selected word line has passed, the semiconductor memory device may determine whether the selected word line is a reference word line at step 807. When the selected word line is not a reference word line, the process proceeds to step 809 where a subsequent word line is selected to perform a program operation, and the program voltage is applied to a selected word line at step 801.

When the selected word line is the reference word line at step 807, the process proceeds to step 811.

At step 811, the semiconductor memory device may perform a partial erase operation on a memory cell group corresponding to the reference word line.

At step 813, the semiconductor memory device determines whether the corresponding word line is a last word line, and terminates the program operation when the corresponding word line is the last word line; otherwise the process returns to step 809 where a program operation on a subsequent word line is performed.

In an embodiment of the present disclosure, when a program turn of the first reference word line is reached during the program operation, the semiconductor memory device may perform a partial erase operation on a first memory cell group corresponding to the first reference word line. Here, the first memory cell group may be memory cells coupled to the plurality of word lines. In an embodiment, word lines included in the memory cell group may include a reference word line, and memory cells included in the memory cell group may be memory cells coupled to a preset number of word lines ranging from the reference word line. In an embodiment, the word lines included in the memory cell group may be a preset number of word lines ranging in a lower direction from a word line adjacent to the reference word line. For example, when an N-th word line is a reference word line, word lines included in the corresponding memory cell group may be a preset number of word lines ranging from the N-th word line, a preset number of word lines ranging from an N+1-th word line, or a preset number of word lines ranging from an N+2-th word line. In an embodiment, the locations of the reference word line and the word lines included in the memory cell group may be set such that the distance from the reference word line to the word lines is N+2 or more.

Figure 10:
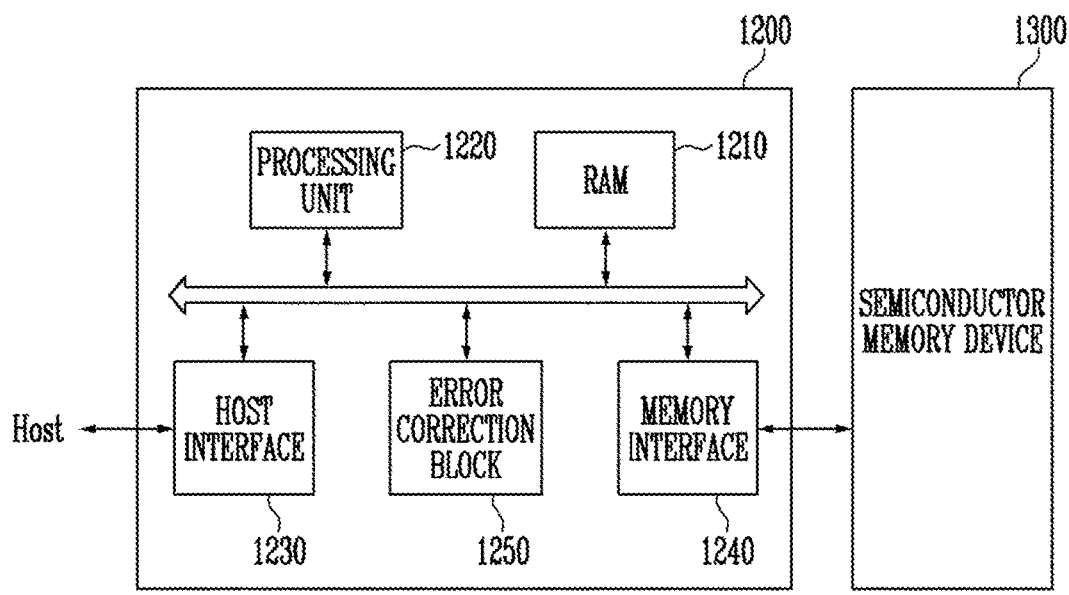
FIG. 10 is a block diagram showing a memory system including the semiconductor memory device of FIG. 2.

FIG. 10 is a block diagram showing a memory system including the semiconductor memory device of FIG. 2.

Referring to FIG. 10, the memory system 1000 includes a semiconductor memory device 1300 and a controller 1200.

The semiconductor memory device 100 may have the same configuration and operation as those of the semiconductor memory device described with reference to FIG. 1. Hereinafter, repetitive explanations will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the host Host and the semiconductor memory device 1300. The controller 1200 is configured to run firmware for controlling the semiconductor memory device 1300.

The controller 1200 includes a RAM (Random Access Memory) 1210, a processing unit 1220, a host interface 1230, a memory interface 1240, and an error correction block 1250.

The RAM 1210 is used as at least one of an operation memory of the processing unit 1220, a cache memory between the semiconductor memory device 1300 and the host Host, and a buffer memory between the semiconductor memory device 1300 and the host Host.

The processing unit 1220 controls overall operation of the controller 1200.

The processing unit 1220 is configured to randomize data received from the host Host. For example, the processing unit 1220 may randomize data received from the host Host using a randomizing seed. The randomized data is provided, as data to be stored, to the semiconductor memory device 1300 and is then programmed in the memory cell array.

The processing unit 1220 is configured to derandomize data received from the semiconductor memory device 1300 during a read operation. For example, the processing unit 1220 may derandomize the data received from the semiconductor memory device 1300 using a derandomizing seed. The derandomized data may be outputted to the host Host.

In an embodiment, the processing unit 1220 may perform randomize and derandomize operations by running software or firmware.

The host interface 1230 includes a protocol for performing data exchange between the host Host and the controller 1200. In an exemplary embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1240 interfaces with the semiconductor memory device 1300. For example, the memory interface includes a NAND interface or NOR interface.

The error correction block 1250 uses an error correcting code (ECC) to detect and correct an error in data received from the semiconductor memory device 1300.

The controller 1200 and the semiconductor memory device 1300 may be integrated into a single semiconductor device. In an exemplary embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1200 and the semiconductor memory device 1300 may be integrated into a single semiconductor device to form a solid state drive (SSD). The SSD includes a storage device formed to store data in a semiconductor memory. When the memory system 1000 is used as the SSD, an operation speed of the host Host coupled to the memory system 1000 may be phenomenally improved.

In another embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 1300 or the memory system 1000 may be embedded in various types of packages. For example, the semiconductor memory device 1300 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 11:
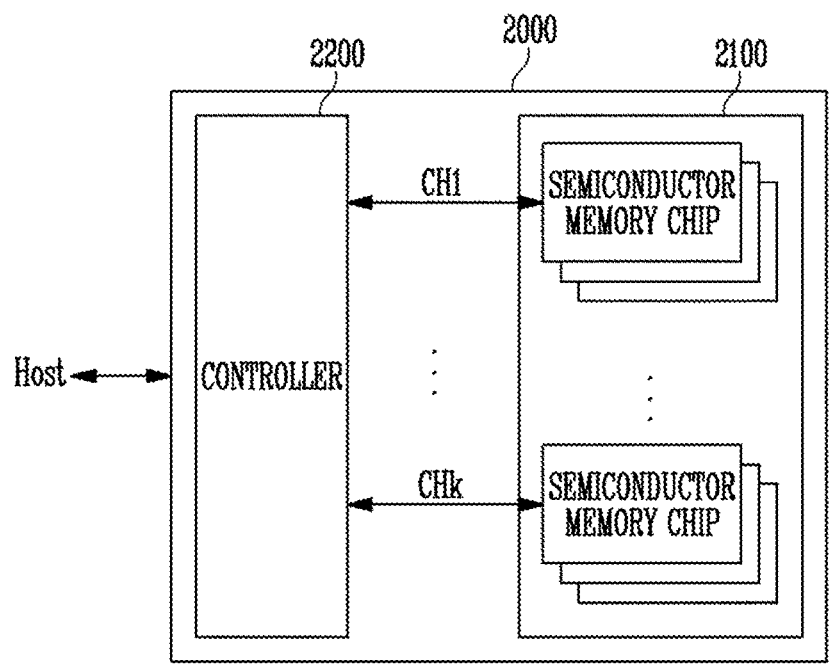
FIG. 11 is a block diagram showing an example of an application of the memory system of FIG. 10.

FIG. 11 is a block diagram showing an example 2000 of application of the memory system 1000 of FIG. 10.

Referring to FIG. 11, the memory system 2000 includes a semiconductor memory device 2100 and a controller 2200. The semiconductor memory device 2100 includes a plurality of memory chips. The semiconductor memory chips are divided into a plurality of groups.

In FIG. 11, it is illustrated that each of the plurality of groups communicates with the controller 2200 through first to k-th channels CH1 to CHk. Each semiconductor memory chip may have the same configuration and operation as those of an embodiment of the semiconductor memory device 100 described with reference to FIG. 2.

Each group communicates with the controller 2200 through one common channel. The controller 2200 may have the same configuration as that of the controller 1200 described with reference to FIG. 10 and is configured to control a plurality of memory chips of the semiconductor memory device 2100 through the plurality of channels CH1 to CHk.

In FIG. 11, a description has been made such that a plurality of semiconductor memory chips are coupled to a single channel. However, it should be understood that the memory system 2000 may be modified such that a single semiconductor memory chip is coupled to a single channel.

Figure 12:
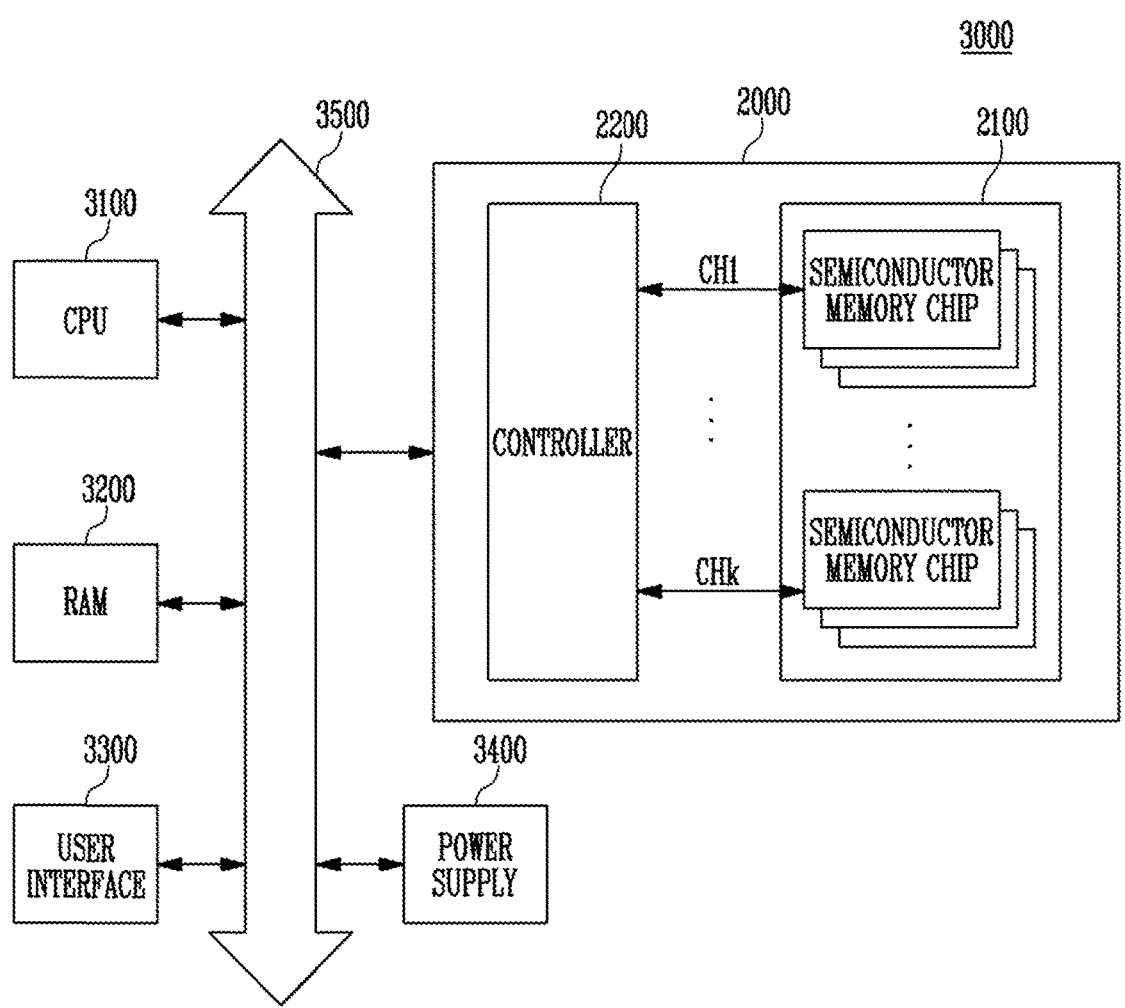
FIG. 12 is a block diagram showing a computing system including the memory system described with reference to FIG. 11.

FIG. 12 is a block diagram showing a computing system including the memory system described with reference to FIG. 11.

Referring to FIG. 12, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 12, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 12, the memory system 2000 described with reference to FIG. 11 is illustrated as being used. However, the memory system 2000 may be replaced with the memory system 1000 described with reference to FIG. 10. In an embodiment, the computing system 3000 may include all of the memory systems 1000 and 2000 described with reference to FIGS. 10 and 11.

In accordance with embodiments of the present disclosure, there are provided a semiconductor memory device which has improved reliability and a method of operating the semiconductor memory device.

Although exemplary embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may be not always performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:

a memory block configured to include a plurality of memory cell strings arranged between bit lines and a common source line;

a peripheral circuit configured to perform an erase operation and an erase verify operation on the memory block; and control logic configured to control the peripheral circuit to perform the erase verify operation on the memory block using a first verification voltage for memory cells included in a first word line group among a plurality of word lines connected to the memory block and a second verification voltage for memory cells included in a second word line group corresponding to word lines other than the first word line group, wherein the first verification voltage is lower than the second verification voltage.

2. The semiconductor memory device according to claim 1, wherein the second word line group includes a plurality of reference word lines.

3. The semiconductor memory device according to claim 2, wherein the memory block comprises a plurality of memory cell groups corresponding to the plurality of reference word lines, respectively.

4. The semiconductor memory device according to claim 3, wherein each of the plurality of memory cell groups comprises memory cells coupled to a preset number of word lines ranging in a lower direction from a corresponding reference word line, among the plurality of reference word lines.

5. The semiconductor memory device according to claim 1, wherein the first word line group is relatively close to the bit lines than the second word line group.

* * * * *